United States Patent
Connolly

(12) 
(10) Patent No.: US 6,198,147 B1
(45) Date of Patent: Mar. 6, 2001

(54) DETECTING INFRARED AND VISIBLE LIGHT

(75) Inventor: Kevin M. Connolly, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/110,806

(22) Filed: Jul. 6, 1998

(51) Int. Cl.[7] .................................................. H01L 31/00
(52) U.S. Cl. .......................... 257/461; 257/458; 257/449; 257/440; 257/443; 257/442
(58) Field of Search ............................... 257/53, 292, 431, 257/440, 442, 443, 444, 449, 458, 461

(56) References Cited

U.S. PATENT DOCUMENTS

| | | | |
|---|---|---|---|
| 4,677,289 | * 6/1987 | Nozaki et al. | 257/440 |
| 5,373,182 | * 12/1994 | Norton | 257/440 |
| 5,567,975 | * 10/1996 | Walsh et al. | 257/442 |
| 5,682,037 | * 10/1997 | De Cesare et al. | 257/458 |

\* cited by examiner

*Primary Examiner*—Minh Loan Tran
(74) *Attorney, Agent, or Firm*—Trop, Pruner & Hu, P.C.

(57) ABSTRACT

A photosensitive element may be formed by an upper layer which is sensitive to visible light and a lower layer which is sensitive to infrared radiation. By making the upper device infrared transparent, the upper device can detect visible light while the lower device detects infrared radiation in one single detector. In some embodiments a plurality of pixels may be provided, only some of which contain both the first and second layers.

3 Claims, 2 Drawing Sheets

DETECTING INFRARED AND VISIBLE LIGHT

BACKGROUND

This invention relates generally to photosensitive devices useful, for example, in digital cameras, scanners, imaging sensors and the like.

Complementary Metal Oxide Semiconductor (CMOS) image sensors are an attractive alternative to conventional charge coupled device (CCD) image sensors. This is in part due to the possibility of lower power consumption, integration of on-chip computation and lower cost associated with the CMOS image sensors. Conventional CMOS image sensors detect light in the visible spectrum. These devices are commonly used as the image sensors in digital cameras, scanners and similar devices. An infrared filter, associated with a CMOS image sensor, removes the infrared component from ambient light. Thus, the image sensor is only exposed to light in the visible spectrum.

The detection of infrared radiation has many useful applications. For example, cameras with infrared night vision could be used in security and baby monitoring applications. In addition, the infrared light patterns are useful as markers in three dimensional (3D) imaging applications. Thus, while conventional CMOS image sensors detect visible light, there are many uses for infrared light detectors.

Conventionally, photosensitive devices are sensitive to both visible light and to infrared radiation, but through the use of filters, specific wavelengths are detected. Thus, different detectors are used to detect different wavelength spectra such as visible and infrared radiation.

However, it would be very desirable to have a single apparatus that is capable of detecting both visible and infrared spectra without substantially increasing the cost or the size of the detector.

SUMMARY

In accordance with one aspect, a photosensitive element includes a first device which is sensitive to light in the visible spectrum. A second device is arranged beneath the first device. The second device is sensitive to light in the infrared spectrum.

DETAILED DESCRIPTION

Figure 1:
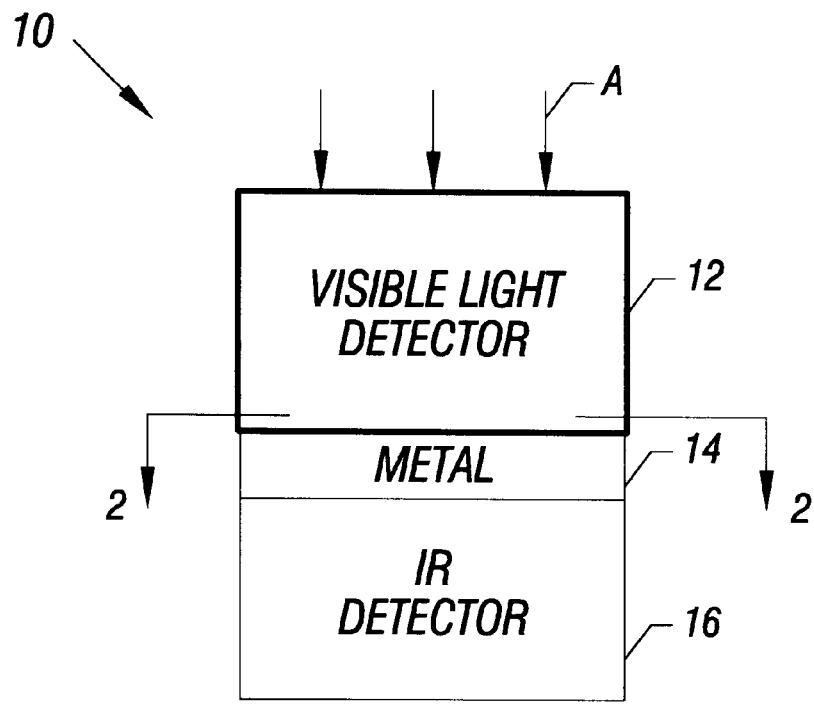
FIG. 1 is a block diagram of a photosensitive element which detects both visible light and infrared radiation.

Referring to FIG. 1, a photosensitive device 10 includes a visible light detector 12, a metal layer 14, and an infrared detector 16. When light, indicated as "A," is incident on the upper surface of the visible light detector 12, the visible component of light is absorbed and detected in the detector 12 while the infrared component passes through the detector 12 and the metal layer 14 to the infrared detector 16 where it is detected.

Figure 2:
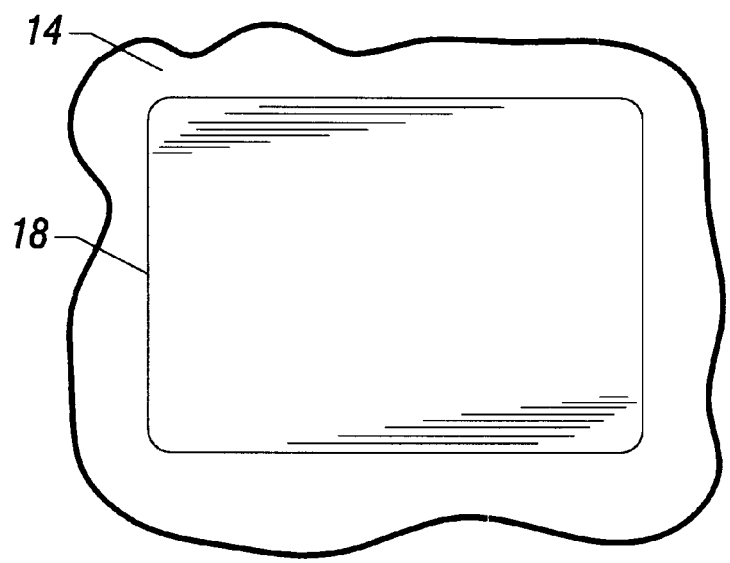
FIG. 2 is a cross-sectional view taken generally along the line 2—2 in FIG. 1.

As shown in FIG. 2, the metal layer 14 used to make electrical contact to the visible light detector 12 may include an opening 18 over an underlying pixel sensor to allow passage of the infrared radiation portion of the incident light so that the infrared radiation may be received by the detector 16. Alternatively, the metal layer 14 may be made sufficiently thin to pass infrared radiation.

Figure 3:
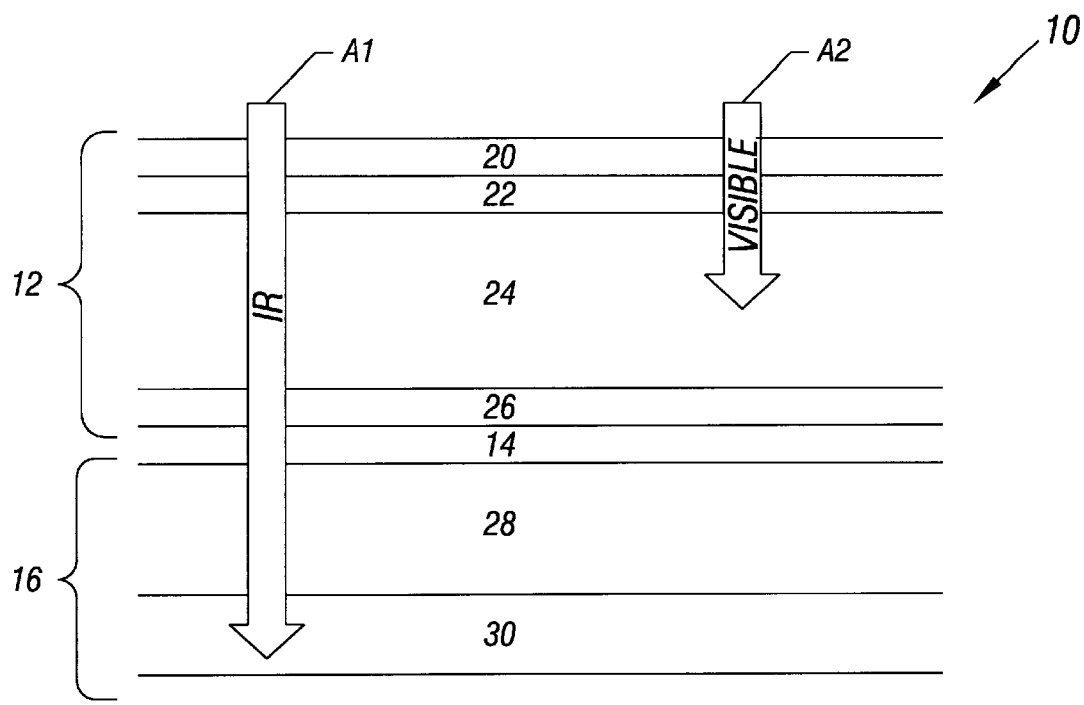
FIG. 3 is an enlarged, schematic cross-sectional view of the layers of the device shown in FIG. 1.

Referring now to FIG. 3, the photosensitive device 10 may include an upper diode on top (DOT) structure as the visible light detector 12 and a lower pixel array forming the infrared detector 16. The detector 12 may be formed on top of a conventional photosensitive sensor array acting as the detector 16. In particular, the detector 16 may include vias and other interconnection structures 28 positioned on top of a layer of crystalline silicon 30 conventionally used in CMOS integrated circuits.

The crystalline silicon layer 30 may include photosensitive elements that are sensitive to infrared radiation. The detector 16 is illustrated as being a CMOS detector but it could be a charge coupled device or CCD detector as well. It is not necessary that the detector 16 only be sensitive to infrared radiation but instead it could be sensitive to both infrared and visible radiation. However, because the visible radiation is absorbed by the detector 12, substantial visible radiation would be unlikely to reach the detector 16.

The diode on top structure for the detector 12 may be formed by depositing layers on top of a conventional crystalline silicon semiconductor structure. The uppermost layer 20 of the detector may be a transparent conductor which acts as an upper contact. It may be advantageously implemented using indium tin oxide (ITO).

The layers below the layer 20 form a p-type, intrinsic, n-type (PIN) diode. The uppermost layer 22 may be formed of p-type amorphous silicon followed by an intrinsic amorphous silicon layer 24 and an n-type amorphous silicon layer 26. The n-type amorphous silicon layer 26 is contacted by the metal layer 14. The metal layer 14 may be formed, for example, of chromium. The metal layer 14 connects to the underlying control circuitry contained in the detector 16. Other photosensitive materials that may be used for the detector 12 include cadmium telluride, mercury cadmium telluride, and polymers such as poly[2-methoxy-5-(2'-ethylhexyloxy)-1,4-phenylene vinylene] or MEH-PPV.

Since the p-type and n-type amorphous silicon layers 22 and 26 are advantageously thin, they are not efficient collectors of light. They exist to create a biased region across the intrinsic amorphous silicon layer 24. The intrinsic amorphous silicon layer 24, on the other hand, absorbs incident photons and converts them to electron-hole pairs. The intrinsic layer 24 may be on the order of 0.25 to 1.0 microns thick to collect incident photons. The thickness of the layer 24 may be tailored to absorb light in the visible spectrum and to pass infrared radiation. The n-type amorphous silicon layer may be on the order of 20 nanometers thick and the p-type amorphous silicon layer 22 may be on the order of 10 nanometers thick. The transparent layer 20 may be 100 to 200 nanometers thick. With this type of arrangement, the detector 12 does not absorb a significant amount of light at infrared wavelengths (above 790 nanometers). Thus, the infrared light passes through the detector 12, as indicated by the arrow A1. The infrared radiation is absorbed by the photosensitive elements in the crystalline silicon layer 30. However, the visible light, indicated by the arrow A2, is absorbed by the intrinsic amorphous silicon layer 24.

The upper detector 12 is designed to allow infrared light to pass so that it may be detected in the lower detector 16.

Meanwhile, the upper detector 12 absorbs the visible spectrum and detects visible light. In this way, a single element 10 may be provided which detects both infrared and visible spectrum light and can analyze the separate light sources as independent components without requiring extra space on the semiconductor die. Thus, a camera may be used in low light applications and in normal daylight applications using the appropriate light spectrum. In addition a camera may be developed which is useful in 3D applications making use of infrared structured light patterns.

The hydrogenated amorphous silicon film layers 22, 24, and 26 may advantageously be formed through the use of plasma enhanced chemical vapor deposition (PECVD), for example. The layers 20 and 14 may be formed by conventional sputtering or other known techniques.

Figure 4:
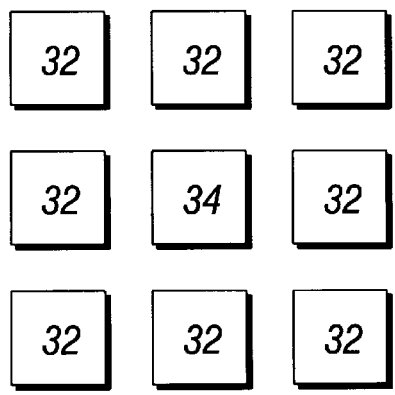
FIG. 4 is a schematic depiction of a 3 by 3 array of pixel sensors in accordance with one embodiment of the present invention.

Due to chromatic aberration in a camera lens system, the infrared component of an image seen may not be in sharp focus. Thus, the infrared component does not need to be sampled with high spatial frequency. Not every pixel needs to have an infrared sensor. As shown in FIG. 4, illustrating an exemplary 3 by 3 pixel array, it is possible to fabricate a cluster of pixels with only one infrared sensitive pixel 34 surrounded by a plurality of visible light sensitive pixels 32. That is, it is possible that only the pixel 34 would have the amorphous silicon detector 12 on top and the crystalline silicon detector 16 beneath the amorphous silicon detector 12. The pixels 32 have the amorphous silicon detector 12 without any crystalline silicon detector 16 formed underneath.

Figure 5:
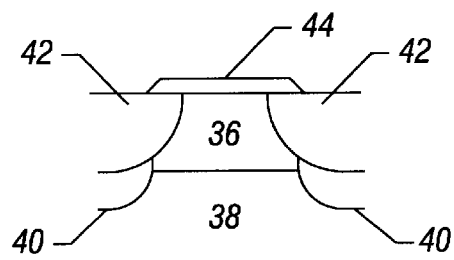
FIG. 5 is an enlarged cross-sectional view of one embodiment of the crystalline silicon photosensitive element.

A variety of conventional photodiodes may be used to detect infrared light since most conventional devices are sensitive to infrared as well as visible light. However, an n-well to p-epitaxial photodiode implemented on a thick epitaxial process may be advantageous to the detector 16. A deep diode n-well junction depth is better suited to collect infrared photons which generate electron-hole pairs deep in the crystalline silicon. One such structure, shown in FIG. 5, includes a diffusion region 36, which may be an n-well, a p-epitaxial layer 38, a p-well 40, an isolation trench 42, and a silicon nitride layer 44. An advantageous n-well junction depth is about 1 micron. The p-epitaxial layer 38 may have a thickness of, for example, about 4 microns, as deposited.

While the present invention has been described with respect to a limited number of embodiments, those skilled in the art will appreciate numerous modifications and variations therefrom. It is intended that the appended claims cover all such modifications and variations as fall within the true spirit and scope of the present invention.

What is claimed is:

1. A photosensitive integrated circuit comprising:

a first photosensitive element including a first device sensitive to light in the visible spectrum and a second device arranged beneath the first device, said second device sensitive to light in the infrared spectrum, said first device is formed atop of said second device; and a second photosensitive element that is only sensitive to light in the visible spectrum and is not sensitive to light in the infrared spectrum, said second photosensitive element spaced from said first photosensitive element.

2. The circuit of claim 1 wherein said second device is formed on a crystalline silicon substrate covered by an epitaxial layer.

3. The circuit of claim 2 wherein said second device includes an N-well over an epitaxial layer that is a P-type layer.

* * * * *